(12) United States Patent
Moussouris et al.

(10) Patent No.: US 8,746,620 B1
(45) Date of Patent: Jun. 10, 2014

(54) ADAPTIVE SOLAR AIRFRAME

(71) Applicant: Sunlight Photonics Inc., South Plainfield, NJ (US)

(72) Inventors: John Peter Moussouris, Palo Alto, CA (US); Sergey V. Frolov, New Providence, NJ (US); Michael Cyrus, Summit, NJ (US)

(73) Assignee: Sunlight Photonics Inc., Edison, NJ (US)

( * ) Notice: Subject to any disclaimer, the term of this patent is extended or adjusted under 35 U.S.C. 154(b) by 0 days.

(21) Appl. No.: 13/747,626

(22) Filed: Jan. 23, 2013

(51) Int. Cl.
*B64C 3/30* (2006.01)
*B64C 1/34* (2006.01)

(52) U.S. Cl.
USPC ............................ 244/123.11; 244/123.1

(58) Field of Classification Search
USPC .................. 244/123.1, 123.11, 219, 30, 31
See application file for complete search history.

(56) References Cited

U.S. PATENT DOCUMENTS 6,607,163 B2 * 8/2003 Perry et al. ............... 244/24
7,270,295 B2 9/2007 Bennett

OTHER PUBLICATIONS

Wellenzohn, Markus and Rainer Hainberger, "Light trapping by backside diffraction gratings in silicon solar cells revisited", Nov. 15, 2011, Optics Express, Volumn 20, No. S1.*
NASA Dryden Fact Sheet—Helios Prototype, dated Dec. 1, 2009, downloaded from http://www.nasa.gov/centers/dryden/news/FactSheets/FS-068-DFRC_prt.htm on Jan. 16, 2013.

* cited by examiner

*Primary Examiner* — Tien Dinh
*Assistant Examiner* — Michael Wang
(74) *Attorney, Agent, or Firm* — Moser Taboada; Alan Taboada

(57) ABSTRACT

Methods and apparatus for an adaptable solar airframe are provided herein. In some embodiments, an adaptable solar airframe includes a solar PV system having at least one solar tracking system and being able to follow the sun position in order to increase sunlight collection and power output; and an expandable body having an aerodynamic cross-section that minimizes parasitic air drag at any given thickness of the body, further being at least partially transparent to sunlight, further enclosing the solar PV system, and further being able to change its shape in response to changes in the positions of the solar PV system.

22 Claims, 9 Drawing Sheets

ADAPTIVE SOLAR AIRFRAME

FIELD

Embodiments of the present invention generally relate to the improved use of solar energy on aircraft.

BACKGROUND

Unmanned Aerial Vehicles (UAVs) are unpiloted aircraft that are either controlled remotely or are autonomously flown based on pre-programmed flight plans. UAVs are also commonly categorized based on their design and performance specifications that span the range from miniature low altitude to large High Altitude Long Endurance (HALE) vehicles. HALE UAVs could provide improved service over existing systems in a large number of civil applications, ranging from border patrol and coastal surveillance, monitoring of natural disasters, meteorology and cartography to highly flexible telecommunication relay stations. For example, platforms capable to remain airborne for weeks to months at altitudes of about 10-25 km provide advantages over satellite systems in terms of reduced costs, increased flexibility and higher precision.

The UAV technology is taking an increasingly important place in our society for civilian and military applications. The required endurance is in the range of a few hours in the case of law enforcement, border surveillance, forest fire fighting or power line inspection. However, other applications at high altitudes, such as communication platform for mobile devices, weather research and forecast, environmental monitoring, would require remaining airborne for days, weeks, months or even years. It is possible to reach these goals using electric solar powered platforms. Photovoltaic (PV) cells and modules may be used to collect the solar energy during the day, a part of which may be used directly for maintaining flight and onboard operations with the remainder being stored for the night time.

The use of sunlight as a source of energy for aircraft has many compelling advantages. Solar energy entails zero marginal cost, weight, and emissions per hour of flight. Sunlight provides a maximum of about 1000 W/m$^2$ at sea level, but reaches a more abundant 1400 W/m$^2$ at high altitudes unobstructed by cloud cover. With advances in efficient and light-weight materials for collector, storage, and wing structures, solar aircraft can aspire to sustain flight at high altitudes for days, weeks, even years.

One approach to building a solar airplane is to cover the upper wing surfaces of a plane with photovoltaic cells. This configuration works best when the sun is directly overhead, but it suffers a loss of power proportional to cosine of the angle between the normal of the wing surface and the sun direction. In 1998 the DLR Institute of Flight Systems built the "Solitair" prototype with solar panels that tilt along a single axis to orient towards the sun. This approach works best when the plane can fly in the direction perpendicular to the solar azimuth, but otherwise also suffers a cosine power loss. Such panels also create turbulence, aerodynamic instability and drag. In 1999-2003, AeroVironment and NASA developed the "Helios" UAV prototype. "Helios" wing is segmented into several solar-cell-covered sections connected by hinged joints. The joints allow tilting some of the sections towards the sun, but do not significantly compensate for the cosine power reduction.

A different approach to a "Solar Thermal Aircraft" is disclosed in U.S. Pat. No. 7,270,295 of C. L. Bennett. As shown in FIG. 7 of the above referenced patent, the solar collector is a reflective parabolic trough 110 mounted to rotate freely around its focal axis in an optically transparent section of the aircraft body. A solar tracker aligns the reflective trough with the sun, to concentrate sunlight onto a heat pipe 120 along the focal axis, thereby heating a fluid which transfers solar energy to a heat engine 140 that propels the aircraft.

In contrast to other solar aircraft that propose solar collectors within the airframe of a plane, Bennett's aircraft body and wing pod designs are aerodynamically inefficient. Bennett proposes the optically transparent portion of the fuselage skin to be a strong ultraviolet-resistant polymer film, such as DuPont TEDLAR®, which has excellent transparency, tensile strength, and low weight. However the fixed drag-to-lift characteristics of Bennett's fuselage design will increase the propulsion power needed to remain on station, even at night when the solar collectors are idle.

The entire prior art solar aircraft referenced above suffer a cosine law reduction of power when the sun's direction is not parallel to the normal of the solar panels. The Bennett trough, "Solitair" panels, and other tilting tail wing designs all provide single-tilt compensation only for the banking or roll angle of sun relative to the ideal overhead position. For example, none of these designs can harvest solar power when the aircraft is flying directly towards or away from the sun. Tilting panels and wings should not provide aerodynamic lift, because resulting forces would compromise aerodynamic stability and may even damage the aircraft. Thus, such tilting collectors are essentially pure drag elements, and like the Bennett fuselage will increase propulsion power needed to remain on station, including at night time when the solar panels are idle.

SUMMARY

Embodiments of the present invention generally relate to the improved use of solar energy on aircraft. In particular, the invention relates to an aircraft employing a solar power system integrated into an airframe that adapts the system's orientation and shape to optimize collection of sunlight under varying conditions. The airframe provides streamlining to improve aerodynamic drag and stability, and to relieve wind load and structural weight of the collectors. Under varying sunlight conditions, the airframe and collector are modifiable in flight into a multiplicity of streamlined configurations, to reduce drag and remain on station over larger ranges of time, weather, altitude, and latitude.

At least some embodiments of the present invention may advantageously reduce aerodynamic drag, particularly under low-light or nighttime conditions, by reducing the size of solar collectors and an airframe containing them. The reduction in size can be accomplished by interleaving or folding segmented rigid elements, or by deflating, rolling, or folding flexible elements in both the collector and airframe.

At least some embodiments of the present invention may advantageously improve solar collection efficiency by compensating both for the roll and pitch angles in order to provide normal incidence for sunlight under most flight conditions. The roll angle compensation can be accomplished, for example, by banking the solar collectors with an integrated airframe around the axis of flight. The pitch angle compensation can be accomplished, for example, by increasing the cross-section of the adaptable airframe to provide a greater area of capture of sunlight along the flight direction. At each pitch angle, the aerofoil shape adapts to minimize drag for the particular capture area under given flight conditions.

In some embodiments of the present invention, some airframe surfaces are made of highly transparent flexible films, such as fluoropolymers, which adapt as above to varying conditions—but in this environment the collectors are internal to the aerofoil, and capable of shrinking to a compact size under low-light conditions, or expanding to a larger size and to be steered during high illumination/variable incident angle conditions.

In some embodiments of the present invention, the solar collectors are deposited directly on flexible films that make up a variable portion of the aerofoil surfaces. These flexible films adapt by deflating, rolling or folding to reduce aerodynamic drag under low-light conditions, or to provide near optimal tradeoff with capture area during high illumination and variable incident angle sunlight conditions.

In some embodiments, the collectors are steered to remain nearly orthogonal to the incoming sunlight, thereby being capable of higher conversion efficiency by means of reflective or diffraction grating wave-length division multi-junction photovoltaics.

In some embodiments, an adaptable solar airframe may include: a solar PV system having at least one solar tracking system and being able to follow the sun position in order to increase sunlight collection and power output; and an expandable body having an aerodynamic cross-section that minimizes parasitic air drag at any given thickness of the body, further being at least partially transparent to sunlight, further enclosing the solar PV system, and further being able to change its shape in response to changes in the position of the solar PV system.

In some embodiments, an adaptable solar airframe may include: an expandable body having an aerodynamic cross-section that minimizes parasitic air drag at any given thickness of the body, further being able to change its shape in response to changes in the relative position of the sun; and a flexible solar PV system attached to the surface of the expandable body.

Other embodiments and variations of the invention are discussed in greater detail below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only some embodiments of this invention and are therefore not to be considered limiting of its scope, for the invention may possess other equally effective embodiments.

Figure 1:
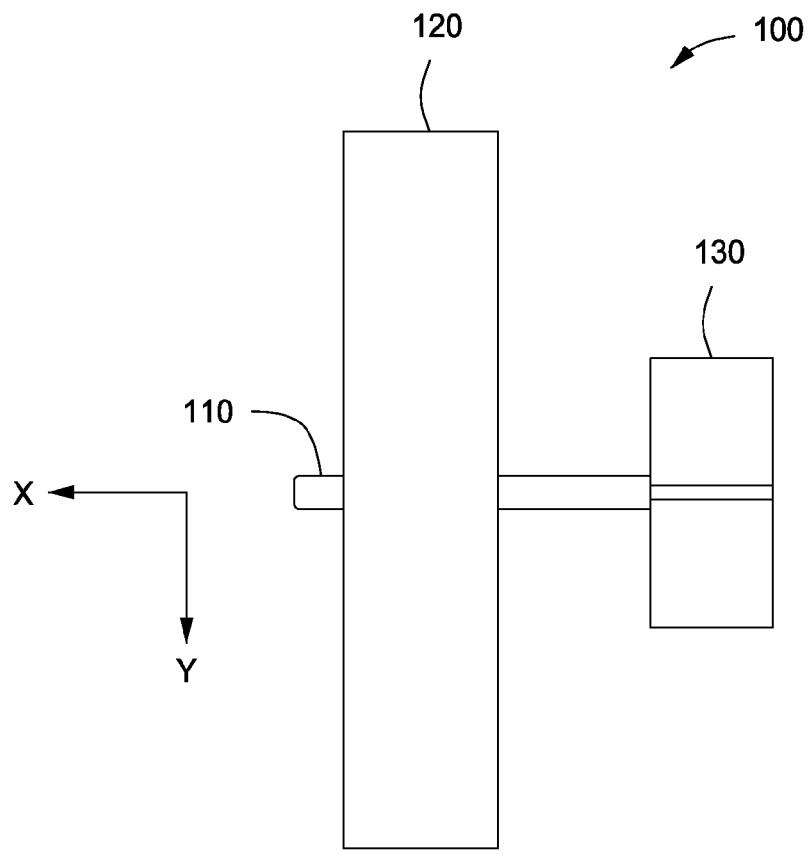
FIG. 1 depicts a schematic view of the main parts of a typical airplane.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

In the present invention, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

FIG. 1 shows schematically the main parts of a typical airplane 100, which include a fuselage 110, a main wing 120 and a tail section 130 (the propulsion system is not shown for simplicity). In addition, there may be other parts that are rigidly or otherwise attached to each other and the rest of the airplane or towed using a flexible line or a cord. These airplane parts may be streamlined and aerodynamically shaped to reduce aerodynamic resistance or drag.

Figure 2:
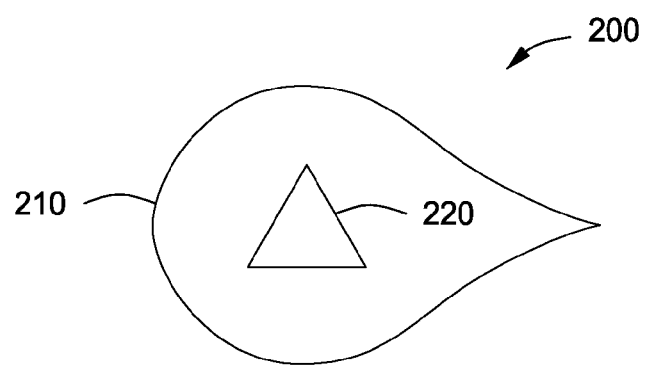
FIG. 2 depicts an adaptable solar airframe comprising an expandable airframe and an integrated solar system in accordance with some embodiments of the present invention.
Figure 3:
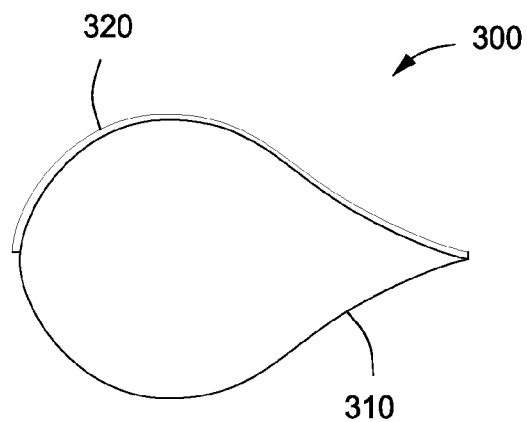
FIG. 3 depicts an adaptable solar airframe comprising an expandable airframe and an integrated solar system in accordance with some embodiments of the present invention.

In accordance with embodiments of this invention, an aerodynamic body is provided that is optimal as a part of a solar-powered aircraft and its airframe. FIGS. 2 and 3 schematically show examples of such aerodynamic bodies, which are further referred to as airframes. FIG. 2 shows an adaptable solar airframe 200 comprising an expandable airframe 210 and an integrated solar system 220. The solar system 220 is all or in part located inside the volume of the airframe 210. The airframe 210 is at least in part transparent to allow sunlight to pass through its surface towards the solar system 220, where it is converted to electricity. Some airframe surfaces may be made from highly transparent flexible films, such as fluoropolymers, with which the airframes can adapt their shape to varying conditions. The solar system 220 is internal to the airframe 210 and capable of folding (or otherwise shrinking) to a compact size under low-light conditions or unfolding (or otherwise expanding) to a larger size and being steered during daytime under variable incident light conditions. FIG. 3 also shows an adaptable solar airframe 300 comprising an expandable airframe 310 and an integrated solar system 320. In this case, the solar system 320 is at least in part located on the surface of the airframe 310. The solar system 320 may comprise for example thin-film PV solar cells and modules that are either attached to the surface of the airframe 310 or imbedded into its skin.

Figure 4:
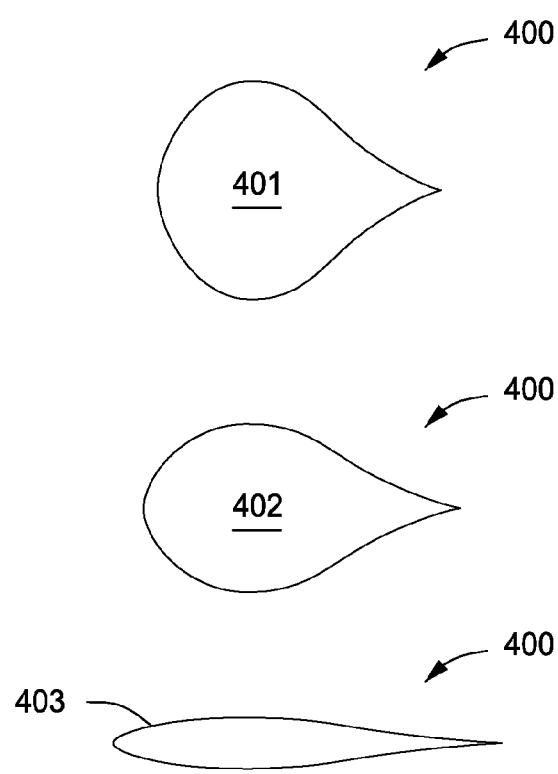
FIG. 4 depicts an expandable airframe in accordance with some embodiments of the present invention.

In accordance with embodiments of this invention, an expandable airframe 400 shown in FIG. 4 may be produced to be used in an adaptable solar airframe, examples of which are shown in FIGS. 2 and 3. In this case the airframe 400 may be made from a single or multiple flexible materials, such as plastic films, fabrics, composite films, etc. The airframe 400 may be able to continuously change its shape and conform to various specific profiles, for example such as 401, 402, and 403 shown in FIG. 4. Changes in the shape of the airframe 400 may be accompanied for example in the reduction of its thickness, so that by transitioning from profile 401 to profiles 402 and 403 the airframe 400 gradually becomes thinner. This capability is attractive for example for use in the adaptable solar airframe 300. The airframe 400 made from non-stretchable materials may maintain its surface area substantially constant, even when transitioning from one shape to another. Nevertheless, the volume (and thickness) of 401 is greater than that of 402, and the volume (and thickness) of 402 is greater than that of 403. Correspondingly, the larger is the volume of the airframe 400, the greater is its aerodynamic drag. For any given volume and thickness of the airframe 400, its shape is modified to reduce the parasitic air drag. Thus, it is important to maintain the minimum possible volume at all time to conserve propulsion power and minimize it to absolute minimum at night time or any other time when the solar system is not in use.

Figure 5:
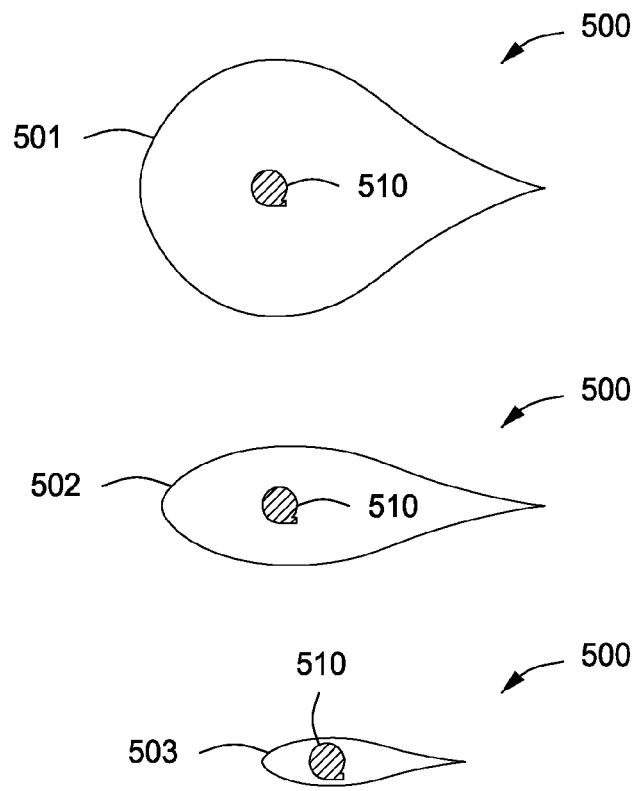
FIG. 5 depicts an expandable airframe in accordance with some embodiments of the present invention.

Alternatively, an expandable airframe 500 shown in FIG. 5 may be produced that may be able to change not only the size of its volume, but also the size of its surface, particularly the size of its external surface, i.e., the wetted area of the airframe. The airframe 500 that is made from stretchable materials may take different shapes, such as for example 501, 502, and 503 shown in FIG. 5. The operation of the airframe 500 in this case may be similar for example to that of an expandable balloon, in which case the overall system may also include an air pump for providing additional internal air pressure. For example, FIG. 5 shows an optional air pump/compressor 510 located inside the expandable airframe 500; alternatively, a pump may be located externally with respect to the expandable airframe and attached to other parts of an airplane. One of the advantages of the expandable airframe 500 is that the volume of the airframe and therefore its aerodynamic drag may be significantly reduced during nighttime when solar cells are not in use. The expandable airframe 500 may be advantageous, for example, in the adaptable solar airframe 200.

Figure 6:
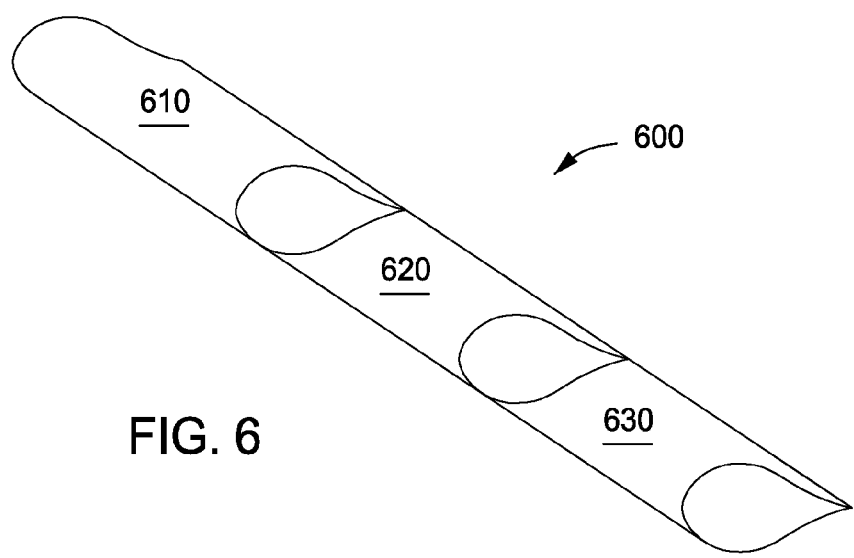
FIG. 6 depicts an airframe comprised of three telescoping sections that may be folded or collapsed into a more compact form in accordance with some embodiments of the present invention.
Figure 7:
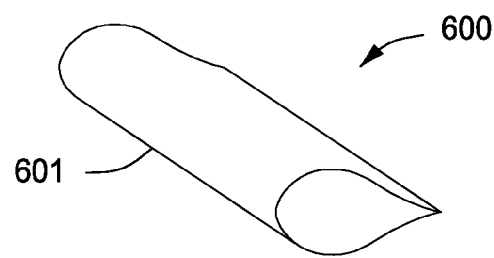
FIG. 7 depicts the airframe of FIG. 6 folded or collapsed into a more compact form.
Figure 19:
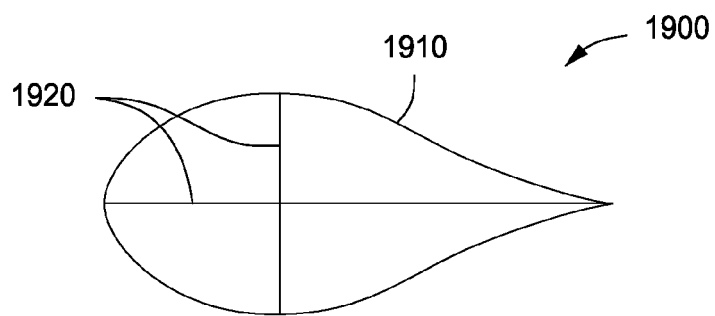
FIG. 19 depicts schematically an expandable airframe comprising an external shell or a canopy held in place by expandable struts in accordance with some embodiments of the present invention.
Figure 20:
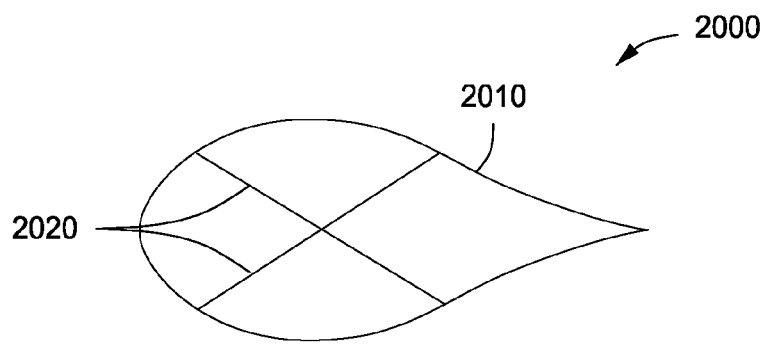
FIG. 20 depicts schematically an expandable airframe comprising an external shell or a canopy held in place by rigid rotating struts in accordance with some embodiments of the present invention.

In addition, an airframe may be expandable not only in the vertical (along the Z axis) and lengthwise directions (along the flight direction or the X axis shown in FIG. 1), but also in the span-wise direction, i.e., along the axis perpendicular to both of the above directions (the Y axis). The expandable airframe may be retractable, telescoping, collapsible, stretchable, flexible, foldable, and so on. For example, FIG. 6 shows an airframe 600 comprised of three telescoping sections 610, 620 and 630 that may be folded or collapsed into a more compact form 601 shown in FIG. 7. The approach illustrated in FIGS. 4-6 aims to reduce aerodynamic drag during flight under any conditions, but particularly under low-light or nighttime conditions by reducing the size of solar collectors and an airframe containing them. The reduction in size can be accomplished by interleaving or folding segmented rigid elements, or by deflating, rolling, or folding flexible elements in both the collector and airframe. FIG. 19 shows schematically an expandable airframe 1900 comprising an external shell or a canopy 1910 held in place by expandable struts 1920. The flexible canopy 1910 may be reshaped by changing the length of the struts 1920. Alternatively, FIG. 20 shows schematically an expandable airframe 2000 comprising an external shell or a canopy 2010 held in place by rigid rotating struts 2020. In this case the shape of the airframe may be changed by turning the struts 2020 and varying their relative angles. Of course, additional struts, structural elements and other approaches may be used in expandable airframes.

Figure 8:
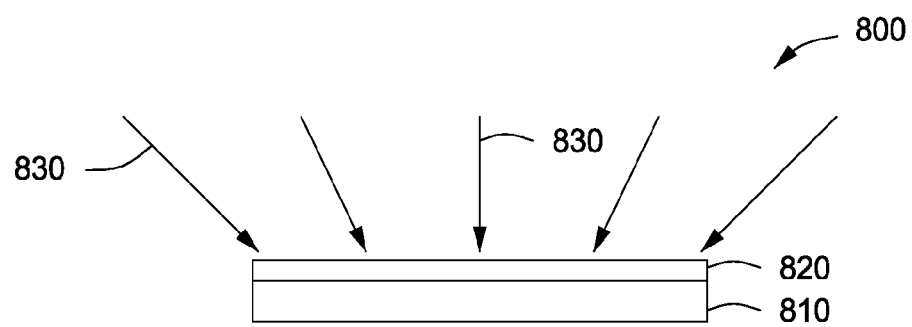
FIG. 8 depicts a solar power system in accordance with some embodiments of the present invention.

In accordance with this invention, the solar system 220 in the adaptable solar airframe 200 may include an exemplary solar system 800 shown in FIG. 8. The solar system 800 comprises a carrier 810 to which solar cells 820 (single or multi-junction) are attached, which may be either flat (i.e., planar) or nonplanar. The solar cells 820 are broad area PV cells able to absorb both direct and scattered sunlight 830 illuminating them and subsequently convert sunlight energy into electricity. The solar system 800 may be used in combination with a tracking system, either single or dual axis, in order to increase its collection efficiency and power production. Furthermore, in case the carrier 810 and solar cells 820 are made of flexible thin-film materials, the solar power system 800 may be used in place of the solar power system 320 in the adaptable solar airframe 300.

Figure 9:
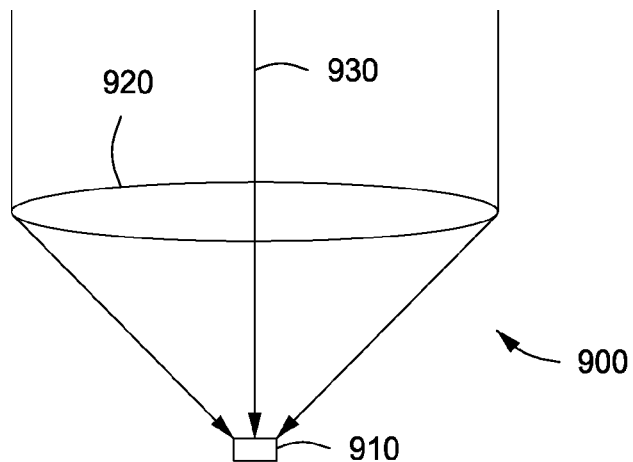
FIG. 9 depicts a solar power system in accordance with some embodiments of the present invention.

The solar power system 220 may also include an exemplary solar power system 900 shown in FIG. 9. The solar power system 900 comprises an efficient solar PV cell or multiple cells 910 and an optical concentrator 920. The solar PV cell 910 may be an efficient multi-junction solar cell, whereas the optical concentrator 920 may be a lens, a Fresnel lens, a parabolic mirror, or combinations thereof. In some cases it may be preferable to combine the cells 910 and the concentrator in the same housing, so that the solar light 930 may be transferred from the concentrator to the cells through free space. Alternatively, the optical concentrator 920 may be a more complex apparatus, which combines light focusing elements with light guiding elements. In this case the cells 910 and concentrator 920 may be in separate housings, so that the solar light 930 may be collected with the concentrator in one location and then transmitted via light guiding elements, e.g., optical fiber or mirrors, to the cells in another location in the adaptable solar airframe. The solar power system 900 primarily collects direct sunlight; therefore it may be mounted onto a sun-tracking system, typically a dual-axis tracker.

Figure 10:
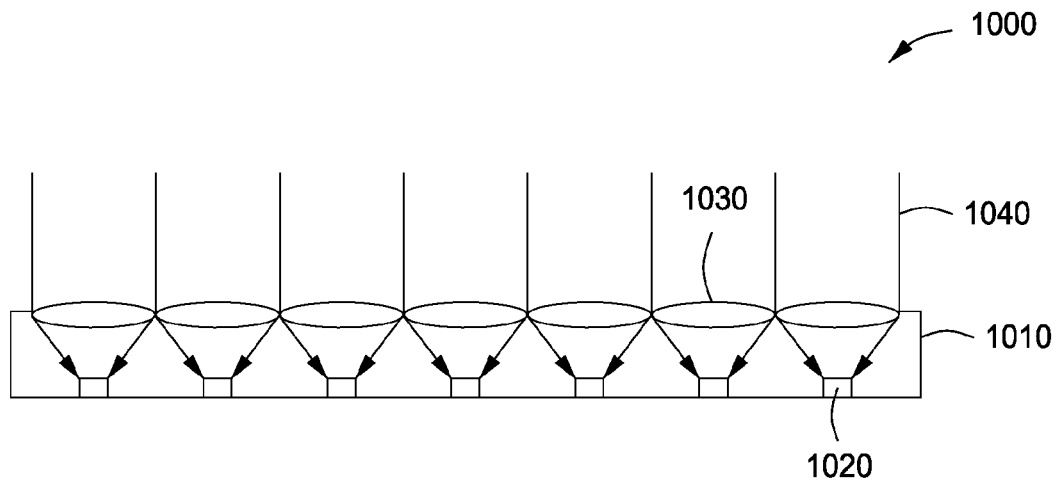
FIG. 10 depicts a solar power system in accordance with some embodiments of the present invention.

In another example, a solar system 1000 shown in FIG. 10 may be used. It comprises a frame 1010, plurality of solar cells 1020 and optical concentrators 1030. As in solar system 900, this system relies primarily on the direct sunlight and thus needs a sun tracker. In this case each concentrator 1030 focuses sunlight 1040 on its corresponding solar cell 1020. Subsequently, the volume of the solar system 1000 may be reduced with respect to that of the solar system 900 without changing its effective active area.

Figure 14:
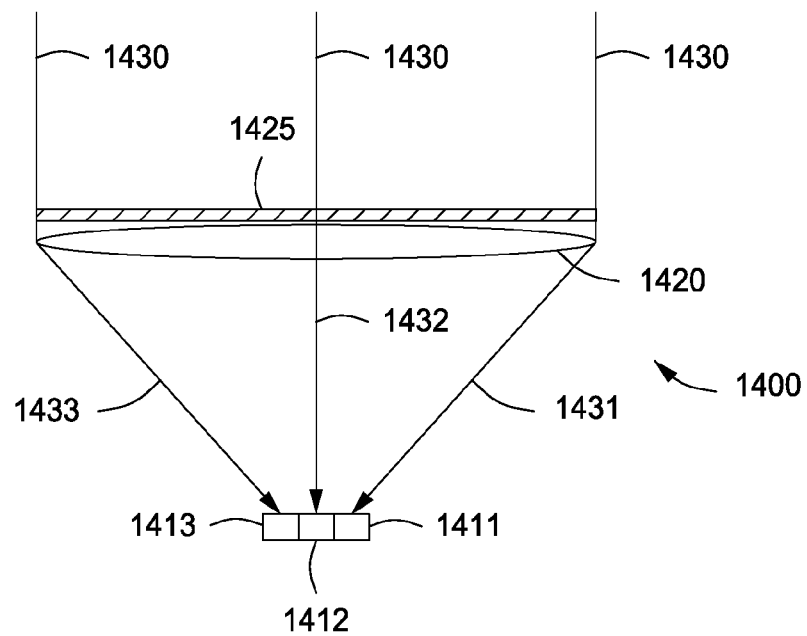
FIG. 14 depicts a solar power system in accordance with some embodiments of the present invention.

The solar system 220 may also include an exemplary solar system 1400 shown in FIG. 14. The solar system 1400 comprises an array of multiple (in this instance three) PV cells 1411, 1412, and 1413, an optical concentrator 1420 and an optical dispersive element 1425. The solar cells 1411-1412 may be single or multi-junction solar cells that are optimized to convert specific spectral parts of solar light 1430 with high efficiency, for example by varying the optical bandgap of the absorber materials in corresponding cells. Thus, the cell 1411 may have the highest bandgap absorber and absorb the short-wavelength part of solar spectrum. The cell 1412 may have the middle bandgap absorber and absorb the middle portion of the solar spectrum and correspondingly the cell 1413 may have the lowest bandgap absorber and operate in the longest wavelength portion of the sunlight spectrum. The optical concentrator 1420 may be a lens, a Fresnel lens, a parabolic mirror, or combination thereof. The dispersive element 1425 may be one or more of a transmissive grating, a reflective grating, a holographic gating, a prism, or other type of dispersive elements. The dispersive element 1425 serves the purpose of splitting the solar beam into spatially separate parts of solar spectrum (slices), so that beam 1431 may be the shortest wavelength portion, beam 1432 may be the middle wavelength portion and beam 1433 may be the longest wavelength portion. Each of these beams is focused onto the corresponding cell in the array. The solar spectrum may be split into any other number of spectral slices (other than three), for example two, four, five, etc. Accordingly, the number of solar cells in the array may be changed to match or correspond to the number of spectral slices. The solar system 1400 may be mounted onto a sun-tracking system, preferably a dual-axis tracker.

Figure 11:
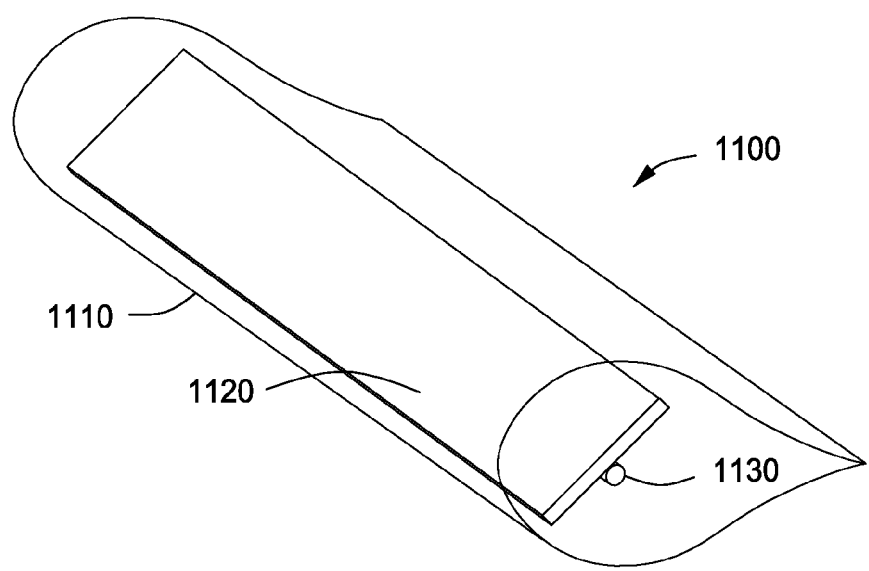
FIG. 11 depicts an adaptable solar airframe in accordance with some embodiments of the present invention.
Figure 12:
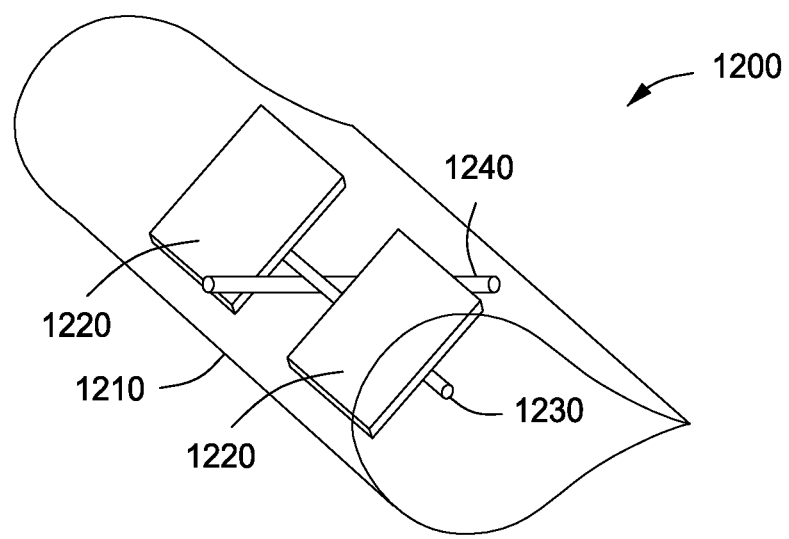
FIG. 12 depicts an adaptable solar airframe in accordance with some embodiments of the present invention.
Figure 13:
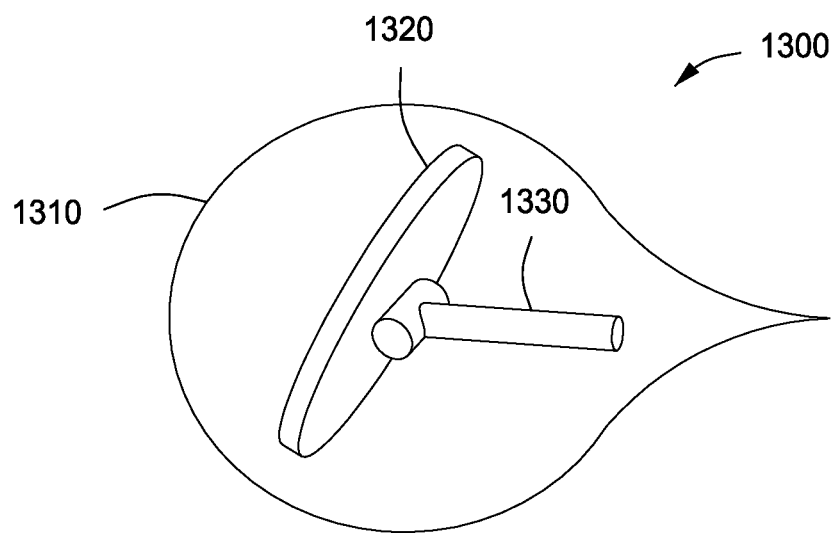
FIG. 13 depicts an adaptable solar airframe in accordance with some embodiments of the present invention.

FIG. 11 shows an exemplary adaptable solar airframe 1100, which comprises an expandable airframe 1110, a solar system 1120 and a single axis solar tracking system 1130. The expandable airframe 1110 acts as a canopy and may be constructed from a transparent flexible plastic held in place by flexible and retractable ribs and struts. The solar system 1120 may be for example at least one flat PV module, e.g., like the solar system 800 shown in FIG. 8, that can be tilted towards the sun to provide optimum exposure. Alternatively, the solar system 1120 may include a concentrated solar PV system, similar for example to the solar power system 1000 shown in FIG. 10. The solar power system 1120 includes a single axis tracker, which allows tilting solar modules, panels and other elements of this solar system in a single plane. In order to further increase solar exposure, the whole airframe 110 may be tilted or rotated in another plane that is not coplanar with the tilting plane of the tracking system 1130. Furthermore, an additional tracker may be added as shown in FIG. 12. FIG. 12 shows an exemplary adaptable solar airframe 1200, which comprises an expandable airframe 1210, a solar system 1220 and a dual axis solar tracking system comprising two orthogonal rotating axes 1230 and 1240. The solar power system 1220 may include a plurality of PV modules. These modules may be tilted in any direction using the internal dual axis tracking system to maximize solar exposure and therefore collected solar energy, without rotating or moving the airframe 1200. Of course, other implementations of this aspect of the invention are possible. For example, FIG. 13 shows an adaptable solar airframe 1300 that also comprises an adaptable airframe 1310 and a solar PV system 1320 with a dual axis tracking system 1330. The solar PV system 1320 and the dual axis tracking system 1330 may be as described above. In this case the transparent adaptable airframe 1310 may be for example a dome or a pod providing aerodynamic cover for an internal solar power system.

Figure 15:
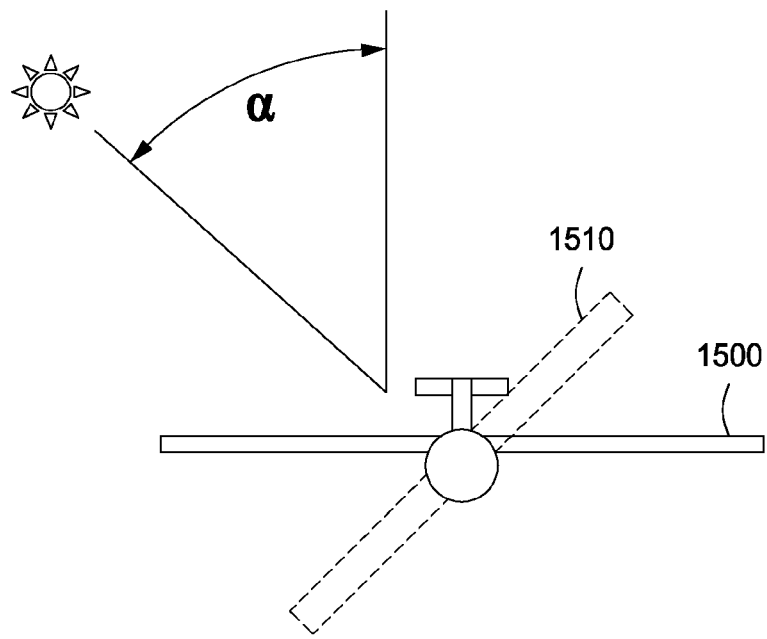
FIG. 15 depicts the head-on view of a plane with an adaptive solar airframe in accordance with some embodiments of the present invention.
Figure 16:
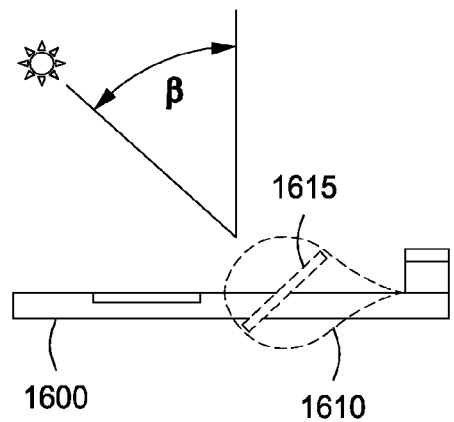
FIG. 16 depicts the side view of a plane with an adaptive solar airframe in accordance with some embodiments of the present invention.

To illustrate advantages of the present invention, FIG. 15 and FIG. 16 show planes with adaptive airframes having their positions adjusted with respect to the relative position of the sun. FIG. 15 shows the head-on view of a plane 1500 with an adaptive solar airframe 1510 having the sun on its right wing at a zenith of α degrees. In order to reduce the cosine loss and maximize solar collection in this position, the adaptive airframe 1510 may be rolled independently from the rest of the plane at a roll angle α matching the solar zenith, as shown in FIG. 15. Alternatively, the solar panels or other solar collectors inside the adaptive airframe 1510 may be tilted at angle α without changing the position of the canopy or the outer shell of the airframe. FIG. 16 shows the side view of a plane 1600 with an adaptive solar airframe 1610 with an internal solar system 1615 flying directly into the sun at a zenith of β degrees. In order to reduce the cosine loss and maximize solar collection in this position, the solar system 1615 may be tilted independently from the rest of the airframe 1610 at a pitch angle β matching the solar zenith, as shown in FIG. 16. The shape of the airframe 1610, particularly its external canopy, is optimized to contain the solar power system 1615 pitched at any specific angle and minimize aerodynamic drag by having smooth streamlined body surface. Similar benefits may be realized with adaptive airframes that have external thin-film solar power systems mounted on their upper surfaces. An adaptable solar airframe may in general compensate for any relative angular position of the sun with respect to a plane by rotating its solar collectors by appropriate roll and pitch angles and thus achieving maximum collection efficiency. Current state-of-the-art approaches do not have these capabilities. Thus, at least some embodiments of the present invention improve solar collection efficiency by compensating both for the roll angle and for the pitch angle of the sun from ideal overhead (normal) incidence. The roll angle compensation is accomplished by banking the solar collectors and airframes around the X axis. The pitch angle compensation is accomplished by tilting solar collectors around the Y axis and thereby increasing the cross-section of the adaptable airframes to provide a greater area of capture of sunlight along the flight direction. At each pitch angle, airframe's shape adapts to provide nearly minimal drag for the given capture area, under existing flight conditions.

Figure 17:
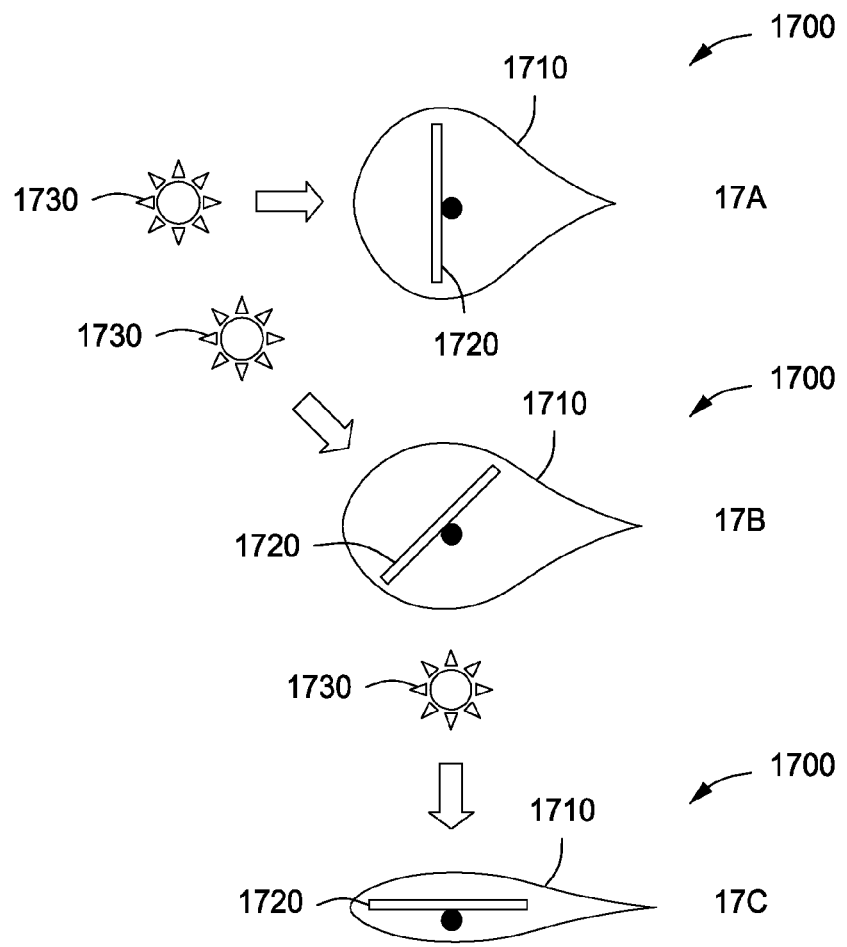
FIGS. 17A-C (collectively referred to as FIG. 17) respectively depict configurations of an adaptive airframe that comprises an expandable airframe and a solar power system having a controllable shape to compensate for different pitch angle of the sun in accordance with some embodiments of the present invention.

To further illustrate the capabilities of an adaptive solar airframe, FIGS. 17A, 17B, and 17C, collectively referred to as FIG. 17, show an exemplary adaptive airframe 1700 that comprises an expandable airframe 1710 and a solar system 1720. FIGS. 17A, 17B, and 17C show how the expandable airframe 1710 changes its shape to compensate for different pitch angle of the sun. FIG. 17A shows the airframe 1700 adopting a streamlined but highest aerodynamic cross-section configuration to collect light efficiently when the sun 1730 is incident along the flight axis (directly in front or behind the aircraft). FIG. 17B shows a smaller cross-section configuration to collect light efficiently when the sun 1730 is at modest pitch angles (forward or rear) off the flight axis. FIG. 17C shows a flat airframe configuration to collect light efficiently when the sun 1730 is nearly perpendicular to the flight axis. In these diagrams, solar collectors or panels of the solar system 1720 are shown interior to the airframe, steered to be normal to the incident sunlight, or retracted at night. Alternatively, PV panels may be attached directly on external airframe surfaces. A third alternative is to provide rigid or semi-rigid segmented collectors on the interior of transparent adaptive airframes, but to simplify control, increase capture area, and reduce weight by relaxing the requirement that the collectors be steered precisely normal to incident sunlight.

Figure 18:
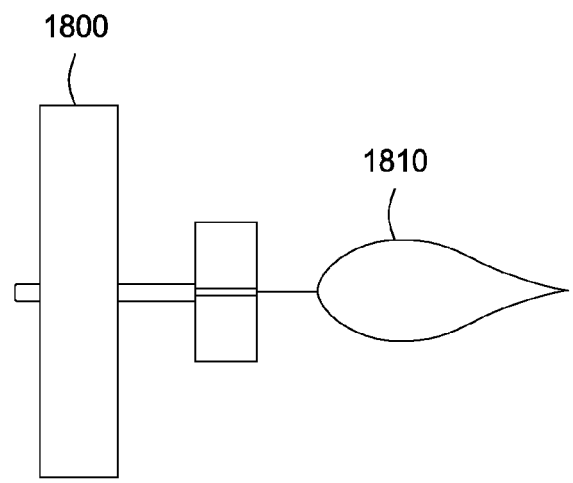
FIG. 18 depicts an adaptable solar airframe made in the form of an inflatable, flexible pod covered with PV solar cells in accordance with some embodiments of the present invention.

The adaptive solar airframes described above may be used as parts of a conventional airplane, such as plane 100 shown in FIG. 1. In this case its fuselage, main wing or parts of the tail section may be modified as an adaptive airframe with an integrated solar system. However, it may be preferred to have an adaptive airframe having zero lift in order to minimize its effects on the flight characteristics of a plane. For example, parts of a fuselage may be used to produce zero-lift adaptive airframes. Alternatively, unconventional airplane designs may be used to have additional zero-lift airframe sections, such as for example airframes 1510 and 1610 in FIGS. 15 and 16, respectively. These sections may be rigidly attached to the fuselage, wings, or parts of the tail. The zero-lift airframe sections may have symmetric airfoil profiles and zero attack angles (an attack angle is the angle between an airfoil and the flight direction), as shown for example in FIGS. 4, 5, and 16. Alternatively, an airplane may have storage compartments from which the adaptable solar airframes may be extracted and expanded for solar collection during daytime and then retracted and stored during nighttime. In one example shown in FIG. 18, an adaptable solar airframe 1810 may be made in the form of an inflatable, flexible pod covered with PV solar cells, so that it can be stored deflated inside the fuselage or tail at night and towed behind a plane 1800 fully inflated during the day.

While the foregoing is directed to embodiments of the present invention, other and further embodiments of the invention may be devised without departing from the basic scope thereof.

The invention claimed is:

1. An adaptable solar airframe comprising:
   a solar PV system having at least one solar tracking system and being able to follow the sun's position in order to optimize sunlight collection and power output; and
   an expandable body having an aerodynamic cross-section, further being at least partially transparent to sunlight, further enclosing the solar PV system, and further being able to change its shape to reduce parasitic air drag while compensating for the changes in the position of the solar PV system as the solar PV system follows the sun's position.

2. The adaptable solar airframe of claim 1, wherein the solar PV system comprises broad area PV cells.

3. The adaptable solar airframe of claim 1, wherein the solar PV system comprises a concentrated PV system.

4. The adaptable solar airframe of claim 3, wherein the solar PV system further comprises an optical dispersive element.

5. The adaptable solar airframe of claim 1, wherein the expandable body is symmetric in shape and produces zero aerodynamic lift.

6. The adaptable solar airframe of claim 1, wherein the solar tracking system is able to provide a variable pitch angle to the solar PV system with respect to the sun.

7. The adaptable solar airframe of claim 1, wherein the solar tracking system is able to provide a variable roll angle to the solar PV system with respect to the sun.

8. The adaptable solar airframe of claim 1, wherein the expandable body comprises flexible plastic film.

9. The adaptable solar airframe of claim 1, wherein the expandable body is operable to expand in the vertical direction.

10. The adaptable solar airframe of claim 1, wherein the expandable body is operable to expand in the span-wise direction.

11. The adaptable solar airframe of claim 1, further comprising an air pump configured to increase air pressure inside the airframe.

12. The adaptable solar airframe of claim 1, further comprising at least one of expandable or rotating struts.

13. The adaptable solar airframe of claim 1, wherein the expandable body is collapsible.

14. An aircraft comprising the adaptable solar airframe of claim 1.

15. The aircraft of claim 14, wherein the adaptable solar airframe is retractable.

16. The aircraft of claim 14, wherein the solar PV system follows the sun by rotating a roll angle and a pitch angle of a solar collector.

17. The adaptable solar airframe of claim 1, wherein:
   the solar PV system tilts at a pitch angle to match the sun position; and
   the expandable body changes its shape to contain the solar PV system at any pitch angle.

18. The adaptable solar airframe of claim 17, wherein the change in shape of the expandable body reduces the parasitic air drag.

19. An airplane comprising the adaptive solar airframe of claim 1.

20. The airplane of claim 19, wherein the adaptive solar airframe has zero lift.

21. The airplane of claim 19, wherein the adaptive solar airframe is a pod that can be towed behind the airplane.

22. The airplane of claim 21, further comprising a storage compartment into which the adaptive solar airframe may be retracted and stored or from which it may be extracted and expanded.

* * * * *